(12) United States Patent
Oxland et al.

(10) Patent No.: US 10,861,933 B2
(45) Date of Patent: Dec. 8, 2020

(54) ELONGATED SEMICONDUCTOR STRUCTURE PLANARIZATION

(71) Applicant: Taiwan Semiconductor Manufacturing Company, Ltd., Hsin-Chu (TW)

(72) Inventors: Richard Kenneth Oxland, Brussels (BE); Blandine Duriez, Brussels (BE); Mark van Dal, Linden (BE); Martin Christopher Holland, Bertem (BE)

(73) Assignee: TAIWAN SEMICONDUCTOR MANUFACTURING COMPANY., LTD., Hsin-Chu (TW)

( * ) Notice: Subject to any disclaimer, the term of this patent is extended or adjusted under 35 U.S.C. 154(b) by 103 days.

(21) Appl. No.: 16/179,645

(22) Filed: Nov. 2, 2018

(65) Prior Publication Data
US 2019/0074355 A1    Mar. 7, 2019

Related U.S. Application Data

(62) Division of application No. 14/927,822, filed on Oct. 30, 2015, now Pat. No. 10,121,858.

(51) Int. Cl.
*H01L 29/06* (2006.01)
*H01L 21/321* (2006.01)
(Continued)

(52) U.S. Cl.
CPC .......... *H01L 29/0676* (2013.01); *B82Y 10/00* (2013.01); *H01L 21/02532* (2013.01);
(Continued)

(58) Field of Classification Search
CPC ............. H01L 21/304; H01L 21/30625; H01L 21/3212; H01L 21/823487;
(Continued)

(56) References Cited

U.S. PATENT DOCUMENTS 5,264,387 A * 11/1993 Beyer ................. H01L 21/3212
257/E21.23
7,425,740 B2   9/2008 Liu et al.
(Continued)

FOREIGN PATENT DOCUMENTS

TW          201532274 A      8/2015

OTHER PUBLICATIONS

USPTO, Patent Application and Drawings; U.S. Appl. No. 14/554,584, filed Nov. 26, 2014, entitled: Graded Heterojunction Nanowire Device, with Filing Receipt dated Jan. 23, 2015, 37 pages.
(Continued)

*Primary Examiner* — Bryan R Junge
(74) *Attorney, Agent, or Firm* — Haynes and Boone, LLP

(57) ABSTRACT

According to one example, a method includes epitaxially growing first portions of a plurality of elongated semiconductor structures on a semiconductor substrate, the elongated semiconductor structures running perpendicular to the substrate. The method further includes forming a gate layer on the substrate, the gate layer contacting the elongated semiconductor structures. The method further includes performing a planarization process on the gate layer and the elongated semiconductor structures, and epitaxially growing second portions of the plurality of elongated semiconductor structures, the second portions comprising a different material than the first portions.

20 Claims, 13 Drawing Sheets

(51) Int. Cl.
- *H01L 29/66* (2006.01)
- *H01L 21/306* (2006.01)
- *H01L 21/02* (2006.01)
- *H01L 21/8234* (2006.01)
- *H01L 29/78* (2006.01)
- *H01L 27/088* (2006.01)
- *B82Y 10/00* (2011.01)
- *H01L 29/40* (2006.01)
- *H01L 29/423* (2006.01)
- *H01L 29/775* (2006.01)

(52) U.S. Cl.
CPC .. *H01L 21/02546* (2013.01); *H01L 21/02549* (2013.01); *H01L 21/02603* (2013.01); *H01L 21/02639* (2013.01); *H01L 21/02642* (2013.01); *H01L 21/30625* (2013.01); *H01L 21/3212* (2013.01); *H01L 21/823412* (2013.01); *H01L 21/823418* (2013.01); *H01L 21/823487* (2013.01); *H01L 27/088* (2013.01); *H01L 29/0688* (2013.01); *H01L 29/401* (2013.01); *H01L 29/42392* (2013.01); *H01L 29/66439* (2013.01); *H01L 29/66469* (2013.01); *H01L 29/66545* (2013.01); *H01L 29/775* (2013.01); *H01L 29/7827* (2013.01)

(58) Field of Classification Search
CPC ......... H01L 21/823885; H01L 29/0676; H01L 29/068; H01L 29/66666; H01L 29/7827
See application file for complete search history.

(56) References Cited

U.S. PATENT DOCUMENTS

| | | | |
|---|---|---|---|
| 7,667,271 B2 | 2/2010 | Yu et al. |
| 8,048,723 B2 | 11/2011 | Chang et al. |
| 8,053,299 B2 | 11/2011 | Xu |
| 8,183,627 B2 | 5/2012 | Currie |
| 8,362,575 B2 | 1/2013 | Kwok et al. |
| 8,367,498 B2 | 2/2013 | Chang et al. |
| 8,415,718 B2 | 4/2013 | Xu |
| 8,440,517 B2 | 5/2013 | Lin et al. |
| 8,497,177 B1 | 7/2013 | Chang et al. |
| 8,497,528 B2 | 7/2013 | Lee et al. |
| 8,609,518 B2 | 12/2013 | Wann et al. |
| 8,610,240 B2 | 12/2013 | Lee et al. |
| 8,618,556 B2 | 12/2013 | Wu et al. |
| 8,633,516 B1 | 1/2014 | Wu et al. |
| 8,680,576 B2 | 3/2014 | Ching et al. |
| 8,703,565 B2 | 4/2014 | Chang et al. |
| 8,723,272 B2 | 5/2014 | Liu et al. |
| 8,729,627 B2 | 5/2014 | Cheng et al. |
| 8,729,634 B2 | 5/2014 | Shen et al. |
| 8,742,509 B2 | 6/2014 | Lee et al. |
| 8,776,734 B1 | 7/2014 | Roy et al. |
| 8,785,285 B2 | 7/2014 | Tsai et al. |
| 8,796,666 B1 | 8/2014 | Huang et al. |
| 8,796,759 B2 | 8/2014 | Perng et al. |
| 8,809,139 B2 | 8/2014 | Huang et al. |
| 8,815,712 B2 | 8/2014 | Wan et al. |
| 8,828,823 B2 | 9/2014 | Liu et al. |
| 8,836,016 B2 | 9/2014 | Wu et al. |
| 8,841,701 B2 | 9/2014 | Lin et al. |
| 8,847,293 B2 | 9/2014 | Lee et al. |
| 8,853,025 B2 | 10/2014 | Zhang et al. |
| 2005/0074972 A1 | 4/2005 | Saito |
| 2005/0263795 A1 | 12/2005 | Choi |
| 2009/0001464 A1 | 1/2009 | Booth, Jr. |
| 2009/0008631 A1 | 1/2009 | Hurkx |
| 2009/0200540 A1 | 8/2009 | Bjoerk |
| 2010/0270611 A1 | 10/2010 | Masuoka |
| 2011/0068407 A1 | 3/2011 | Yeh et al. |
| 2012/0025169 A1 | 2/2012 | Mars |
| 2013/0011983 A1 | 1/2013 | Tsai et al. |
| 2013/0285153 A1 | 10/2013 | Lee et al. |
| 2013/0341733 A1 | 12/2013 | Erickson |
| 2014/0070322 A1 | 3/2014 | Jacob |
| 2014/0166981 A1* | 6/2014 | Doyle ................. H01L 21/0237 257/24 |
| 2014/0183600 A1 | 7/2014 | Huang et al. |
| 2014/0225184 A1* | 8/2014 | Colinge .............. H01L 29/7827 257/329 |
| 2014/0252412 A1 | 9/2014 | Tsai et al. |
| 2014/0264590 A1 | 9/2014 | Yu et al. |
| 2014/0264592 A1 | 9/2014 | Oxland et al. |
| 2015/0069475 A1 | 3/2015 | Colinge |
| 2015/0236092 A1 | 8/2015 | Yu |
| 2016/0293739 A1* | 10/2016 | Zhang ................. H01L 27/0928 |

OTHER PUBLICATIONS

USPTO, U.S. Appl. No. 14/567,252, filed Dec. 11, 2014, Application, Drawings, Filing Receipt, 68 Pages.

USPTO, U.S. Appl. No. 14/640,295, filed Mar. 6, 2015, Application, Drawings, Filing Receipt, 62 Pages.

* cited by examiner

US 10,861,933 B2

ELONGATED SEMICONDUCTOR STRUCTURE PLANARIZATION

PRIORITY INFORMATION

This application is a divisional of U.S. patent application Ser. No. 14/927,822 filed Oct. 30, 2015, and entitled "Elongated Semiconductor Structure Planarization," the disclosure of which is hereby incorporated by reference.

BACKGROUND

In the semiconductor integrated circuit (IC) industry, technological advances in IC materials and design have produced generations of ICs where each generation has smaller and more complex circuits than the previous generation. In the course of IC evolution, functional density (i.e., the number of interconnected devices per chip area) has generally increased while geometry size (i.e., the smallest component (or line) that can be created using a fabrication process) has decreased. This scaling down process generally provides benefits by increasing production efficiency and lowering associated costs. Such scaling down has also increased the complexity of IC processing and manufacturing.

One type of component in an integrated circuit is a nanowire. A nanowire is an elongated semiconductor structure that may be used as part of a transistor. Specifically, portions of the nanowire may be doped to form source and drain regions. Additionally, a gate layer may be formed such that it wraps around the nanowire over a channel region between the source and drain regions of the nanowire.

Nanowires may be formed in a variety of ways. Typically, a nanowire is grown using an epitaxial process. Generally, a single epitaxial process is used to grow multiple nanowires at the same time. But, due to various process characteristics, each of the nanowires may not be the same height after the epitaxial process is complete. For better device operation, it is desirable that such nanowires have a substantially similar height.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1A:
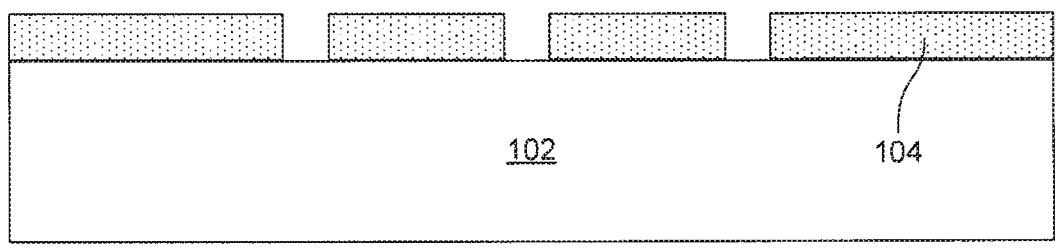
FIGS. 1A, 1B, 1C, 1D, 1E, 1F, 1G, 1H, 1I, and 1J are diagrams showing an illustrative process for forming nanowires with substantially similar heights, according to one example of principles described herein.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

As described above, due to various epitaxial process characteristics, each of the nanowires may not be the same height after the epitaxial process is complete. For better device operation, it is desirable that such nanowires have a substantially similar height. The methods described herein disclose fabrication processes that produce nanowires with substantially similar heights.

According to one example, dual-material elongated semiconductor structures (e.g., nanowires) are formed on a substrate. Additionally, the junctions between the two different semiconductor materials of the elongated semiconductor structures are substantially co-planar. In one example, a first epitaxial process is used to form the lower portions of the elongated semiconductor structures. As described above, such epitaxial processes result in semiconductor structures having different heights. To planarize the heights of the elongated semiconductor structures, a gate layer is first deposited such that it covers each of the elongated semiconductor structures. Then, a planarization process, such as a chemical mechanical polishing (CMP) process, is performed such that the gate layer is reduced to a desired height. Additionally, the planarization process reduces the height of each of the elongated semiconductor structures to match the height of the gate layer. Thus, each of the elongated gate structures as a similar height after the planarization process.

The upper portions of the elongated semiconductor structures can then be formed on top of the lower portions using an epitaxial growth process.

FIGS. 1A-1J are diagrams showing an illustrative process for forming nanowires with substantially similar heights. FIG. 1A illustrates a semiconductor substrate 102 and a patterned template layer 104. The semiconductor substrate 102 may be made of a variety of semiconductor materials such as silicon, germanium, gallium arsenide, indium phosphide, and indium arsenide. In some examples, the semiconductor substrate 102 is a semiconductor wafer.

The template layer 104 may act as a template by exposing certain regions of the substrate 102 to an epitaxial growth process as will be described in further detail below. The template layer 104 may be made of a variety of materials. Such materials may be dielectric materials. Such materials may include, for example, silicon dioxide ($SiO_2$), silicon nitride ($SiN_x$), aluminum oxide ($Al_2O_3$), hafnium oxide ($HfO_2$) or any combination thereof. The template layer 104 may be formed by first depositing the material onto the semiconductor substrate 102. Then, the template layer 104 may be patterned using various photolithographic techniques. For example, a photoresist may be deposited and exposed to a light source using a photomask. Then, the photoresist may be developed such that the pattern exposes the underlying template layer 104 to an etching process. The template layer 104 may have a thickness within a range of about 2-40 nanometers (nm).

Figure 1B:
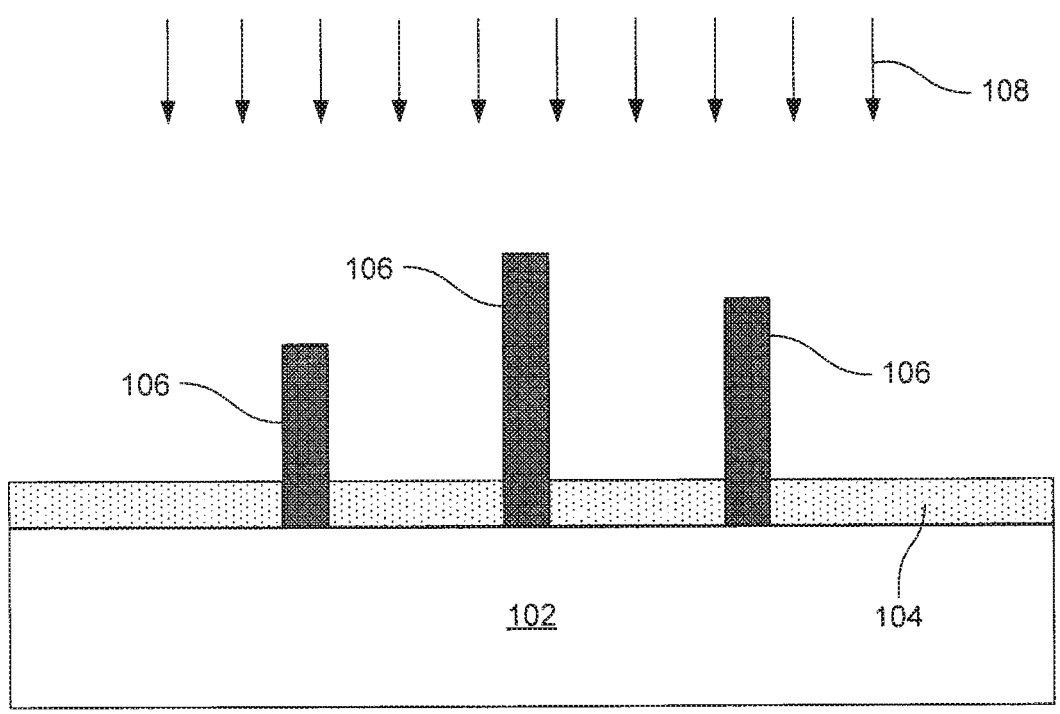

FIG. 1B illustrates an epitaxial growth process 108 by which a plurality of elongated semiconductor structures 106 are formed. The elongated semiconductor structures 106 may be the lower portions of the full elongated semiconductor structures that will eventually be formed. An epitaxial growth process involves the formation of a crystal structure on a crystal substrate. Here, the crystal substrate is the semiconductor substrate 102. The crystal structures being formed are the elongated semiconductor structures 106. The elongated semiconductor structures 106 grow only on the portions of the substrate 102 that are exposed through the template layer 104. As illustrated, due to the nature of the epitaxial growth process 108, different structures may grow at different rates. Thus, when the epitaxial process 108 is complete, the elongated semiconductor structures 106 may have varying heights.

The elongated semiconductor structures 106 may be made of a variety of materials. Such materials may include, for example, silicon, germanium, silicon germanium, indium arsenide, indium gallium arsenide, indium antimonide, and indium gallium antimonide. Additionally, the elongated semiconductor structures 106 may be doped. The doping of the elongated semiconductor structures may occur in-situ. The type of dopant used is based on the type of transistor to be formed. Additionally, the in-situ doping can be changed as the epitaxial growth process 108 proceeds. For example, the in-situ doping can stop and restart as the epitaxial growth process 108 proceeds. In some cases, the doping profile may be graded. In some examples, however, the doping profile may be stepped. Additionally, the in-situ doping can change dopant types during the epitaxial growth process 108. The doping concentration of the elongated semiconductor structures 106 may be within a range of about $1\times10^{15}$-$5\times10^{20}$ $cm^3$. In some examples, if the elongated semiconductor structures 106 include two different materials, such as silicon germanium, the ratio of one material to another may change gradually during the process. Thus, the concentration of the second material may have a graded profile. This may be done, for example, by changing flow rates of a precursor during the epitaxial growth process.

The elongated semiconductor structures may be formed to have a variety of shapes from a top perspective. For example, the elongated semiconductor structures 106 may be substantially circular or elliptical from a top perspective. In some examples, the elongated semiconductor structures 106 may be substantially square or rectangular from a top perspective. In some examples, the elongated semiconductor structures 106 may be substantially hexagonal in shape. In some examples, the elongated semiconductor structures 106 may have an elongated shape from the top perspective. In such examples, the elongated semiconductor structures 106 may be referred to as nanobars.

Figure 1C:
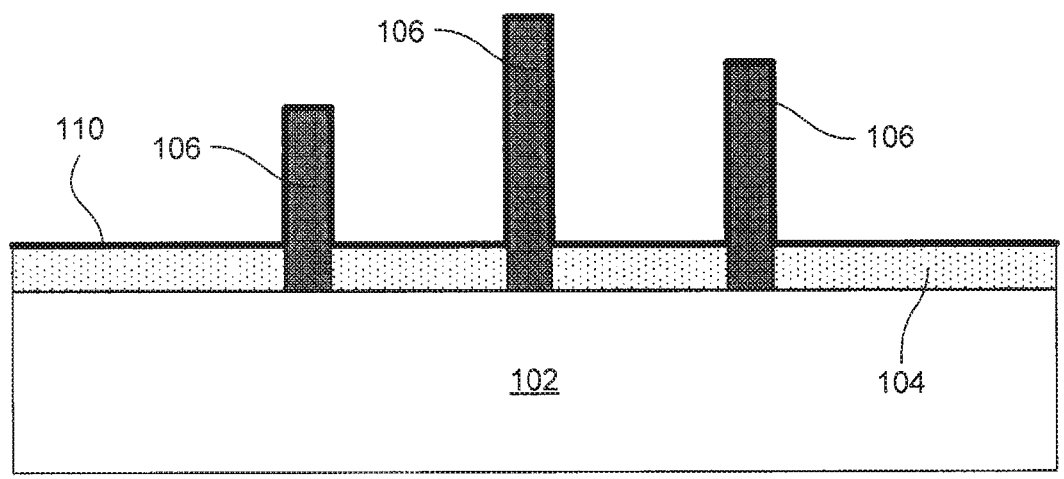

FIG. 1C is a diagram illustrating a dummy dielectric layer 110 formed over the substrate. The dummy dielectric layer 110 is deposited directly on the template layer 104 and directly on the elongated semiconductor structures 106. Specifically, the dummy dielectric layer 110 is disposed on sidewalls of the elongated semiconductor structures as well as the top of the elongated semiconductor structures 106. The dummy dielectric layer 110 may be made of a variety of dielectric materials, such as, silicon dioxide ($SiO_2$), silicon nitride ($SiN_x$), aluminum oxide ($Al_2O_3$), hafnium oxide ($HfO_2$) or any combination thereof.

Figure 1D:
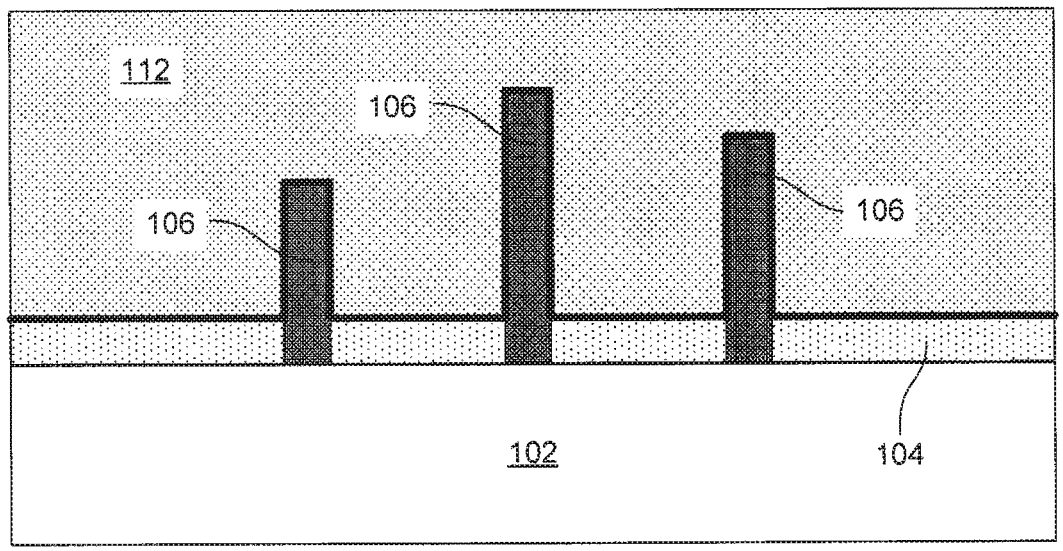

FIG. 1D is a diagram showing illustrative deposition of the gate layer 112. In some examples, the gate layer 112 is a dummy gate layer that will later be replaced by a metal gate. In such a case, to gate layer 112 may be made of polysilicon. The gate layer 112 is deposited such that it covers each of the elongated semiconductor structures 106.

Figure 1E:
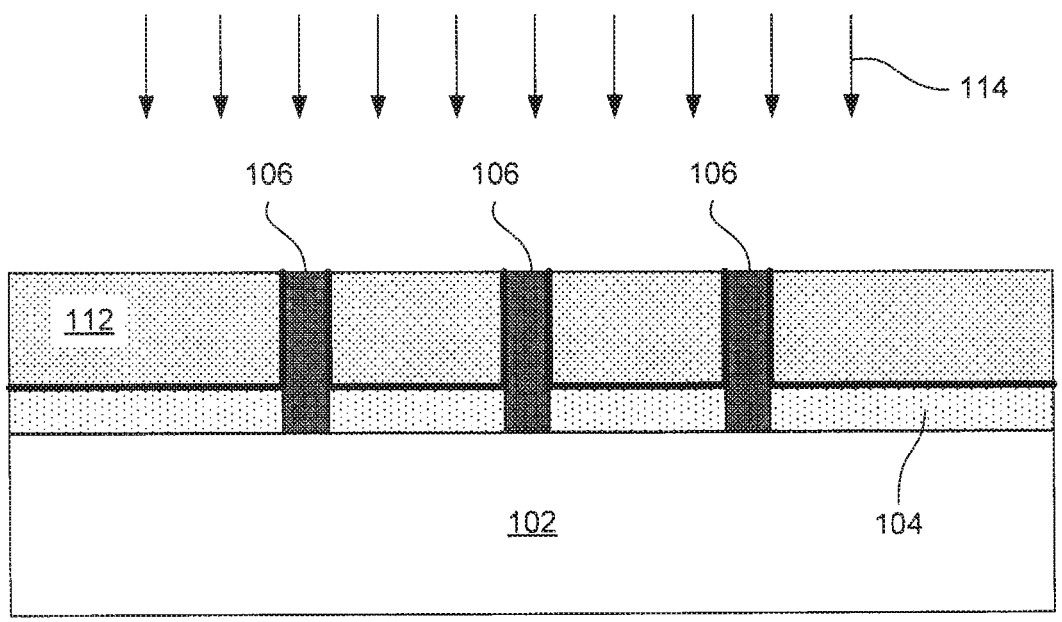

FIG. 1E is a diagram showing an illustrative planarization process 114 that is used to planarize the surface of the gate layer 112 and the elongated semiconductor structures 106. In one example, the planarization process 114 is a CMP process. A CMP process involves the use of a chemical slurry having abrasive particles suspended therein. The slurry is deposited onto the surface of the wafer and a polishing pad is used to polish the surface. The abrasive particles, along with the chemical solution, remove material to create a planar surface. After the planarization process 114, the top surface of the gate layer 112 is substantially coplanar with the top surface of the elongated semiconductor structures 106. In the present example, the CMP process continues until the elongated semiconductor structures 106 have a final height. The elongated semiconductor structures 106 may have a final height within a range of about 5-150 nm.

Figure 1F:
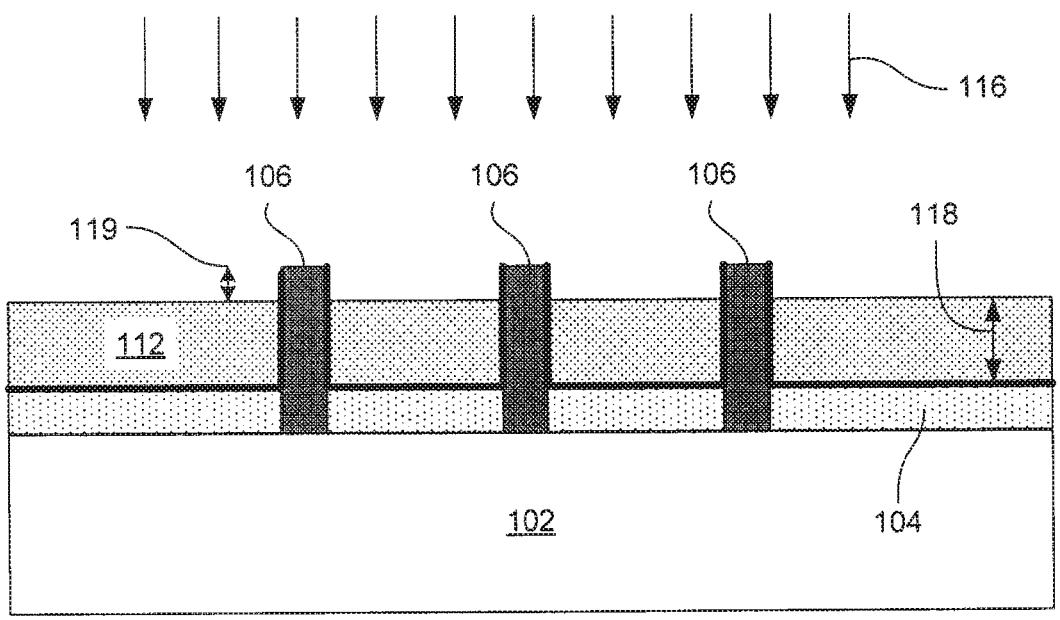

FIG. 1F illustrates a removal process 116, such as an etching process, to create an offset between the elongated semiconductor structures 106 and the top of the gate layer 112. The removal process 116 is selective such that it removes the gate layer 112 while leaving the elongated semiconductor structures 106 substantially intact. The removal process 116 may be a wet etching process or dry etching process. The removal process 116 reduces the height 118 of the gate layer 112 such that there is an offset 119 between the gate layer 112 in the top surfaces of the elongated gate structures 106. As will be explained in further detail below, a second material will be formed on top of the elongated semiconductor structures 106. Thus, the junction between the two materials is offset from the top surface of the gate layer 112. The offset 119 may be within a range of about 0-50 nm.

Figure 1G:
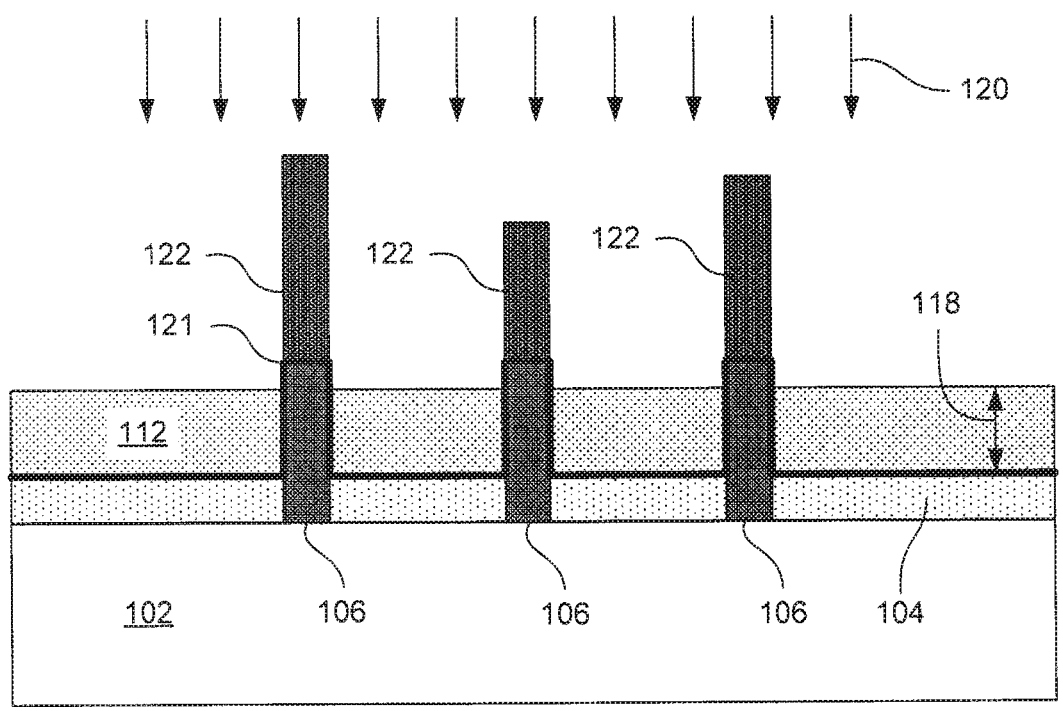

FIG. 1G illustrates an additional epitaxial growth process 120 to form upper portions of elongated semiconductor structures 122. The elongated semiconductor structures 122 are made of a different material than the elongated semiconductor structures 106. In other words, the upper portions of the nanowires are made of a different material than the lower portion of the nanowires. Because the elongated semiconductor structures 106 are planarized, the junctions 121 between the lower portions in the upper portions are substantially coplanar. Additionally, each of the junctions 121 between the lower portions 106 in the upper portions 122 is at a substantially similar distance (i.e., offset) from the top surface of the gate layer 112. This allows for better device performance and consistency. Furthermore, similar to the epitaxial process 108 described above, the epitaxial process 120 results in elongated semiconductor structures 122 having varying heights.

The elongated semiconductor structures 122 may be made of a variety of materials. Such materials may include, for example, silicon, germanium, silicon germanium, indium arsenide, indium gallium arsenide, indium antimonide, and indium gallium antimonide. Additionally, the elongated semiconductor structures 122 may be doped. The doping of the elongated semiconductor structures may occur in-situ. The type of dopant used is based on the type of transistor to be formed. Additionally, the in-situ doping can be changed as the epitaxial growth process 120 proceeds. For example, the in-situ doping can stop and restart as the epitaxial growth process 120 proceeds. Additionally, the in-situ doping can change dopant types during the epitaxial growth process 120. The doping concentration of the elongated semiconductor structures 122 may be within a range of about $1 \times 10^{15}$-$5 \times 10^{20}$ cm$^3$.

Figure 1H:
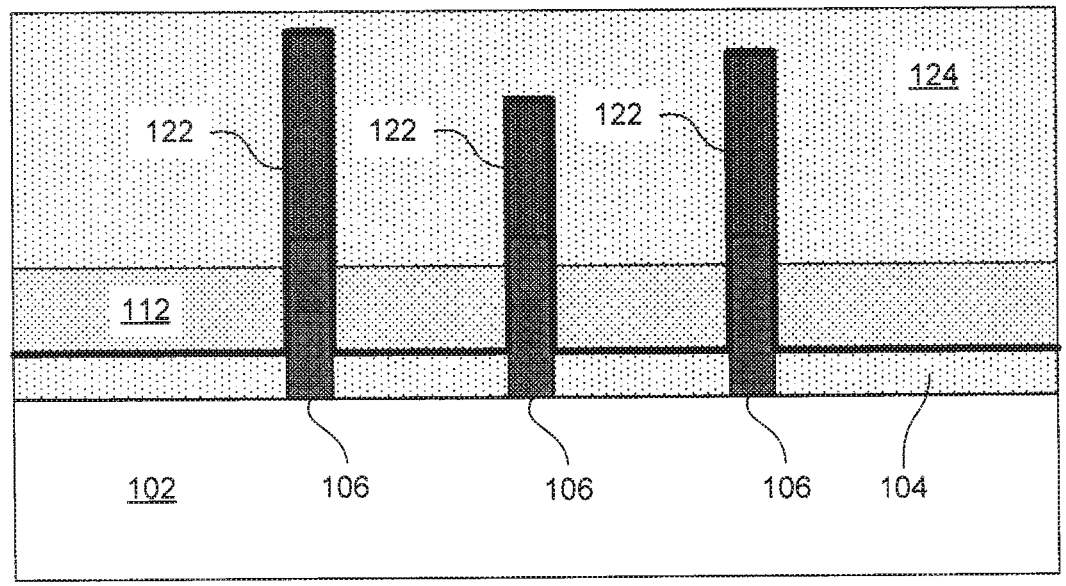

FIG. 1H illustrates deposition of the dielectric layer 124. The dielectric layer 124 may also be referred to as a capping layer. The dielectric layer 124 is deposited such that it covers each of the elongated semiconductor structures 122.

Figure 1I:
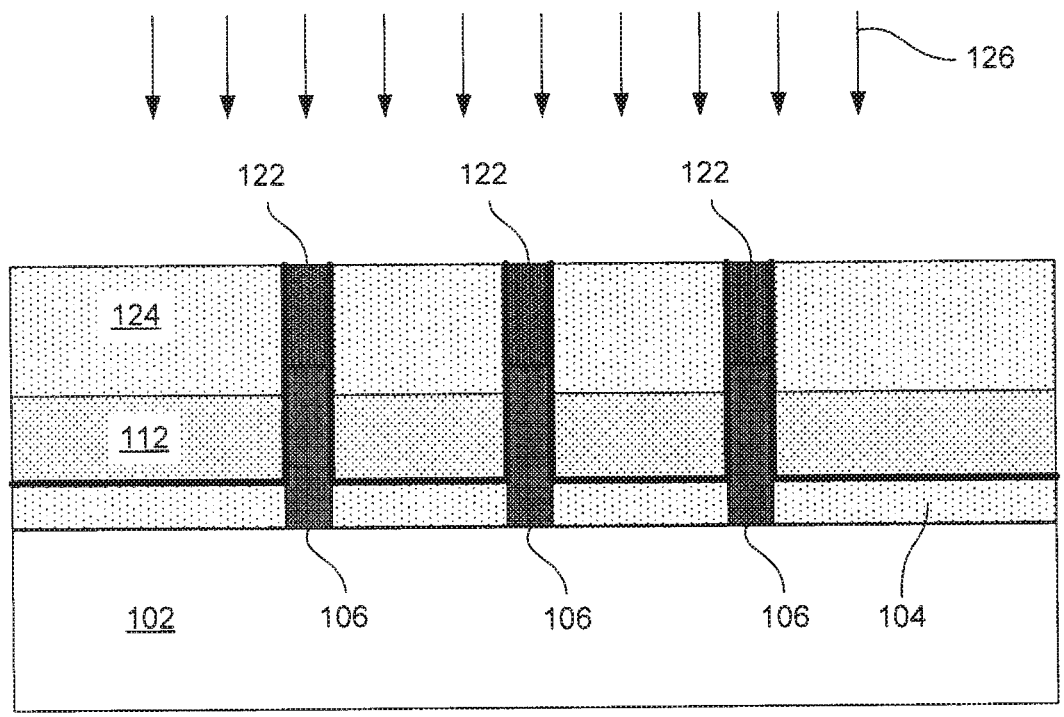

FIG. 1I illustrates a planarization process 126. The planarization process 126 may be, for example, a CMP process. The planarization process 126 planarizes the surface of the wafer so as to expose the top surfaces of each of the elongated semiconductor structures 122. Thus, the height of each of the elongated semiconductor structures 122 is made substantially similar.

Figure 1J:
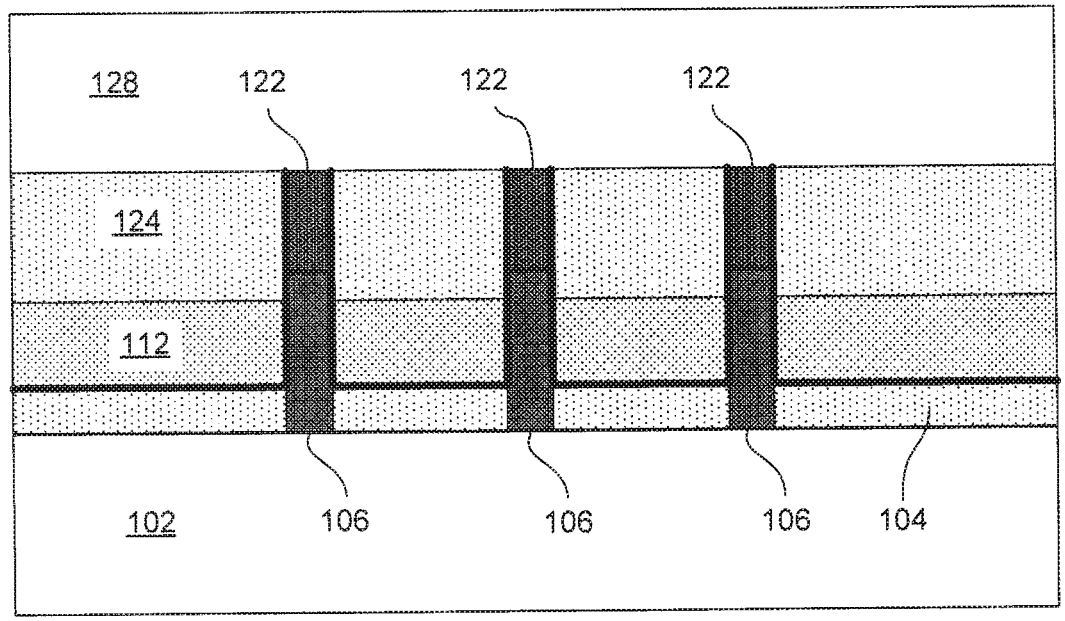

FIG. 1J is a diagram illustrating deposition of an additional dielectric layer 128. In one example, the additional dielectric layer 128 is an inter-layer dielectric (ILD) layer. In some examples, various features may be formed into the additional dielectric layer 128. Such features may include, for example, vias and contacts that connect the elongated semiconductor structures 122 to other components within the circuit.

Figure 2A:
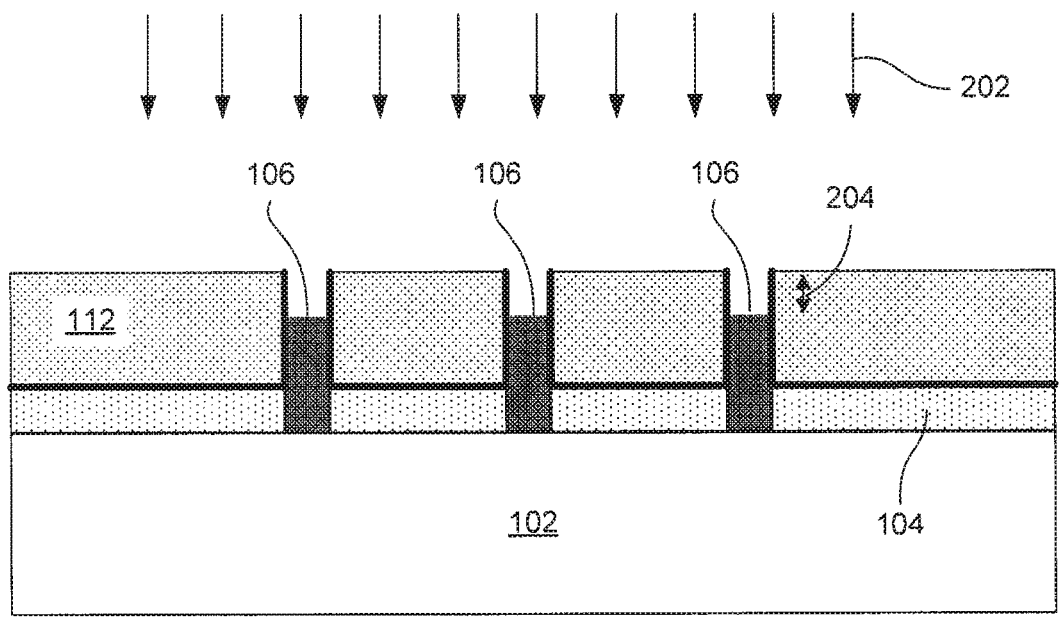
FIGS. 2A and 2B are diagrams showing an illustrative process for forming dual-material nanowires with junctions below an edge of the gate layer, according to one example of principles described herein.
Figure 2B:
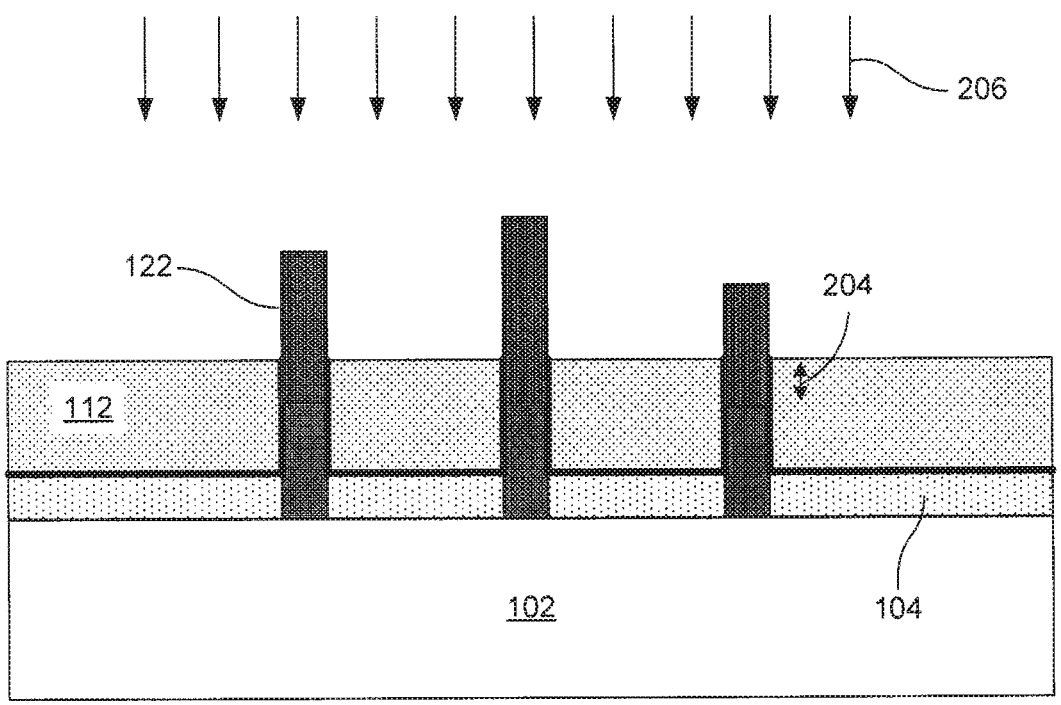

FIGS. 2A and 2B are diagrams showing an illustrative process for forming dual-material nanowires with junctions below an edge of the gate layer 112. In other words, the offset 204 between the top surface of the gate layer 112 and the junctions between the lower portions 106 and upper portions 122 is negative. According to the present example, after the planarization process 114 is performed, a removal process 202 is applied. The removal process 202, as shown in FIG. 2A, removes portions of the elongated semiconductor structures 106 while leaving the gate layer 112 substantially intact. The removal process 202 is applied for as long as it takes to remove the desired amount of material and create the desired offset 204. The removal process may be a dry etch process or a wet etch process, for example.

FIG. 2B illustrates an epitaxial growth process 206 to form the upper portions of the elongated semiconductor structures 106. Epitaxial growth process 206 is similar to the epitaxial growth process 120 described above. Here, however, growth of the upper portions 122 starts at a point that is lower than the top surface of the gate layer 112. The process then continues as described above in the text accompanying FIGS. 1H-1J.

Figure 3A:
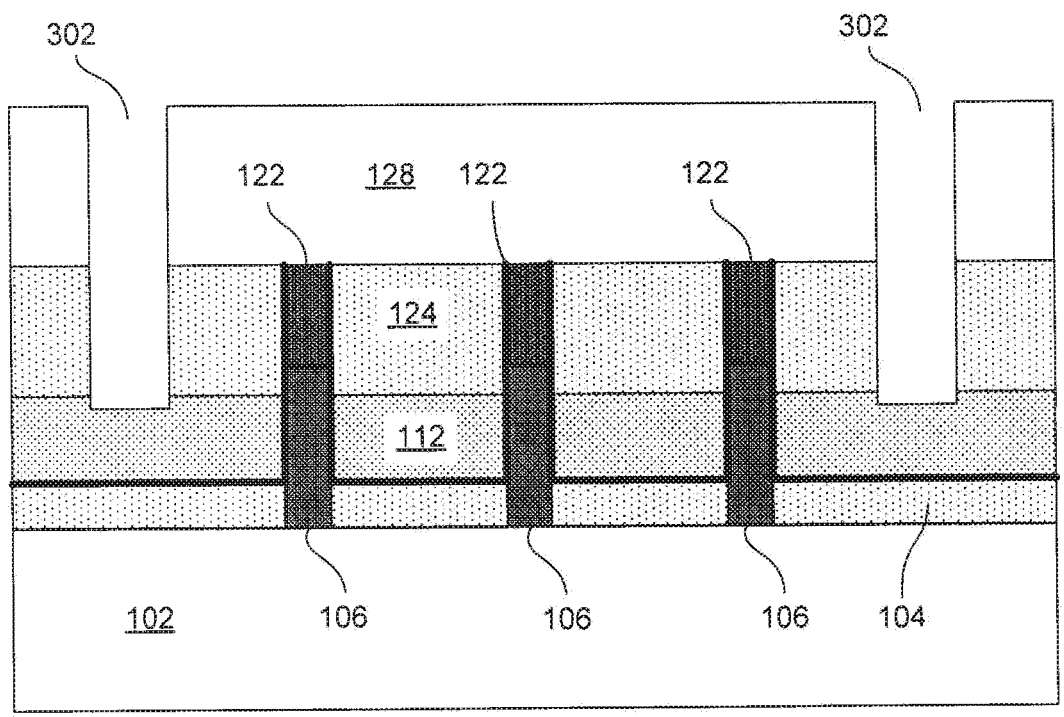
FIGS. 3A and 3B are diagrams showing an illustrative process for replacing a dummy gate layer with a metal gate layer, according to one example of principles described herein.
Figure 3B:
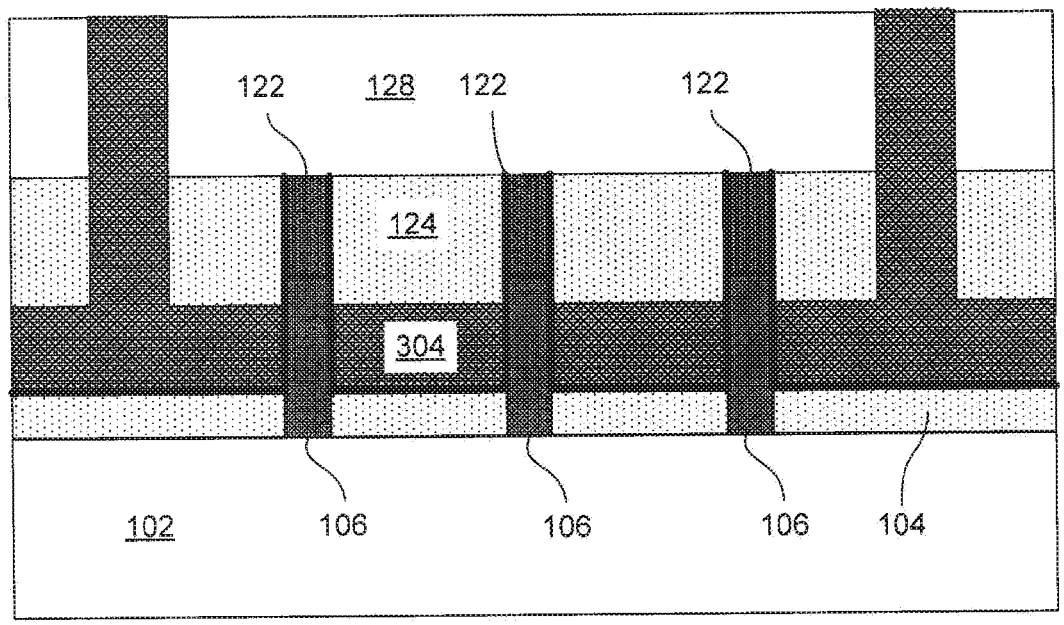

FIGS. 3A-3B are diagrams showing an illustrative process for replacing a dummy gate layer with a metal gate layer. In the present example, replacement of the gate layer 112 occurs after placement of the additional dielectric layer 128. In some cases, however, replacement of the gate layer 112 may occur after the planarization process 126 and before the formation of the additional dielectric layer 128.

FIG. 3A illustrates formation of trenches 302 that extend down to the gate layer 112. In the present example, the trenches 302 extend through the additional dielectric layer 128 and the capping layer 124. The trenches 302 may be formed in a variety of manners. For example, a patterned photoresist layer and/or hard mask layer may be deposited on the surface of the wafer. The regions of the wafer that are exposed through the photoresist layer or hard mask been exposed to an etching process. The etching process may be a dry etching process. A dry etching process is anisotropic and will thus etch downwards in a substantially straight manner.

After the dry etching process is used to expose the gate layer 112, a wet etching process may be used to remove the gate layer 112. A wet etching process is isotropic and thus can remove material in all directions. The wet etching may be selective so as to remove the gate layer 112 material (e.g., polysilicon), while leaving the remaining materials substantially intact. In some examples, the dielectric layer 110 surrounding the elongated semiconductor structures 106 may be removed as well.

FIG. 3B illustrates deposition of a metal material within the space left by the gate layer 112. The metal material forms a metal gate layer 304. The metal gate layer 304 functions as a gate for the transistors formed in part by the elongated semiconductor structures 106, 122. Additionally, the metal material within the trenches 302 may form a via to serve as a gate contact. The metal material used to form the metal gate layer 304 may be one of a variety of materials. For example, the metal material maybe tungsten.

Figure 4A:
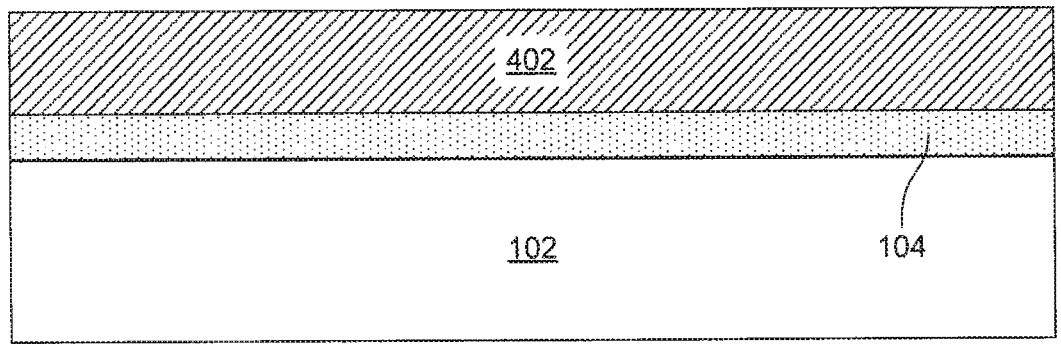
FIGS. 4A, 4B, 4C, and 4D are diagrams showing an illustrative process for forming polish-stop pillars to control heights of the nanowires, according to one example of principles described herein.

FIGS. 4A-4D are diagrams showing an illustrative process for forming polish-stop pillars 404 to control the heights of the nanowires. In some examples, it may be desirable to form elongated semiconductor structures 106 at a specific height. This may be done through use of polish-stop pillars 404. FIG. 4A illustrates a polish-stop layer 402 formed on top of the template layer 104 before the template layer is patterned. The thickness of the polish-stop layer 402 is such that the top of the polish-stop layer 402 corresponds to the desired height of the elongated semiconductor structures 106. The polish-stop layer 402 may be made of a hard material that is resistant to a CMP process. One example of such material may be silicon nitride.

Figure 4B:
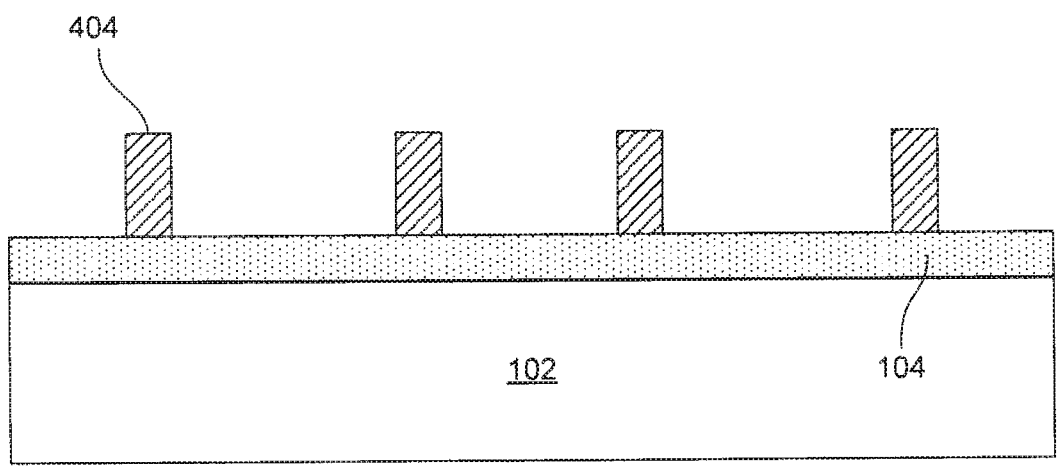

FIG. 4B illustrates the stop layer 402 after it has been patterned to form stop pillars 404. The polish-stop layer 402 may be patterned using various photolithographic techniques. The polish-stop pillars 404 may have a variety of shapes when viewed from a top perspective. For example, the polish-stop pillars 404 may be square, rectangular, circular, elliptical, or may take other shapes. The polish-stop pillars 404 may vary in size as well. The polish-stop pillars 404 may be placed at regions where no other features, such as elongated semiconductor structures 106, are to be placed.

Figure 4C:
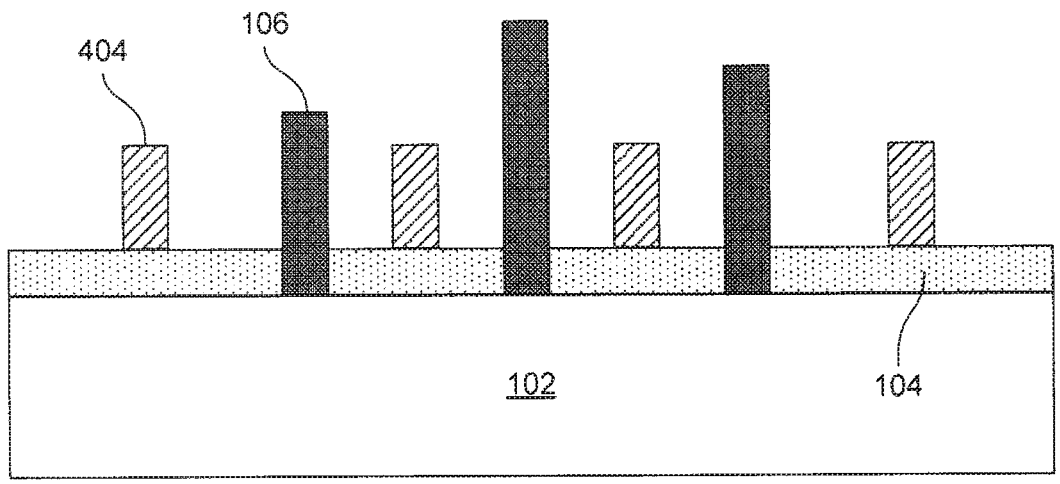
Figure 4D:
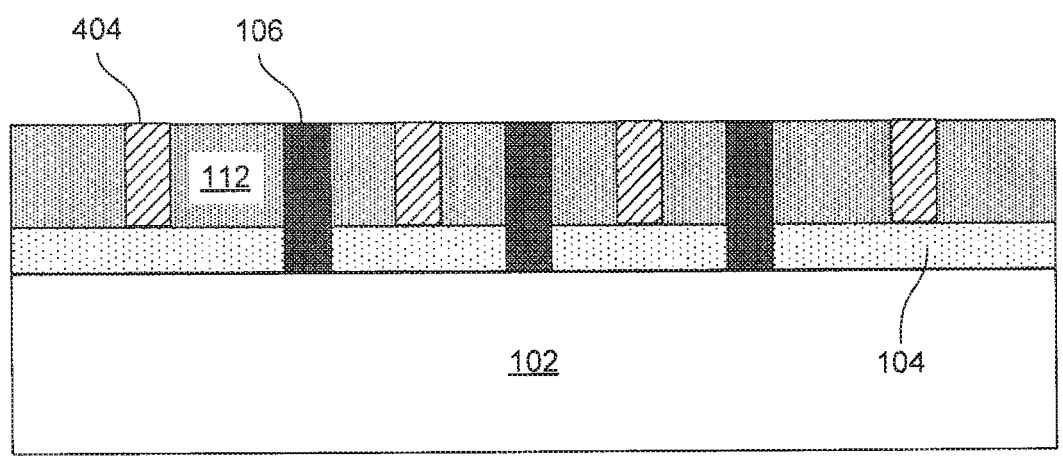

FIG. 4C illustrates formation of the elongated semiconductor structures 106. The elongated semiconductor structures 106 may be formed as described above. FIG. 4D illustrates the planarized elongated semiconductor structures 106 after the planarization process 114 described above. Because the polish-stop pillars 404 are made of a material that is resistant to the CMP process, the CMP process will be prevented from moving forward once it reaches the top of the polish-stop pillars 404. Thus, the polish-stop pillars 404 can be used to control the height of the elongated semiconductor structures 106.

Figure 5:
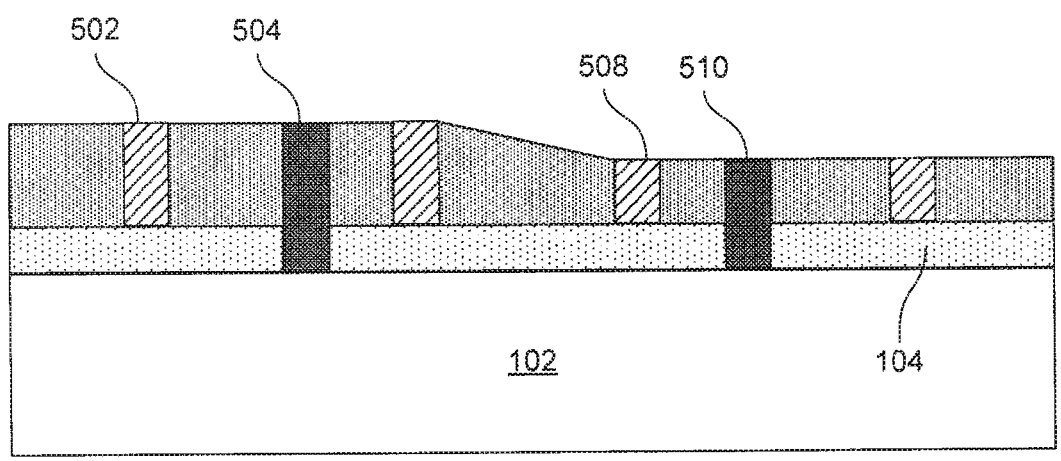
FIG. 5 is a diagram showing polish-stop pillars having different heights, according to one example of principles described herein.

FIG. 5 is a diagram showing polish-stop pillars 502, 508 having different heights. In some cases, it may be desirable to have elongated semiconductor structures that have different heights. Thus, in some examples, polish-stop pillars 502, 508 at different regions of a wafer may have different heights. In the present example, polish-stop pillar 502 has a greater height than polish-stop pillar 508. Thus, the elongated semiconductor structures 504 near polish-stop pillar 502 have a greater height than the elongated semiconductor structures 510 near polish-stop pillar 508.

FIGS. 6A-6D are diagrams showing an illustrative process for forming both N-type and P-type nanowires. Integrated circuits typically include both N-type and P-type transistors which together form complementary metal oxide semiconductor (CMOS) circuits. N-type and P-type nanowire transistors may use different types of semiconductor material as well as being doped with different types of dopant.

Figure 6A:
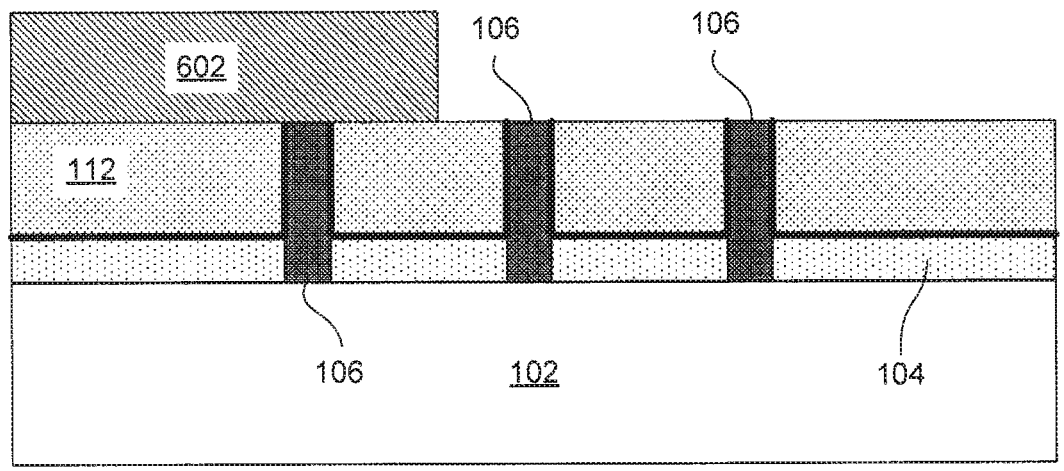
FIGS. 6A, 6B, 6C, and 6D are diagrams showing an illustrative process for forming both N-type and P-type nanowires, according to one example of principles described herein.
Figure 6B:
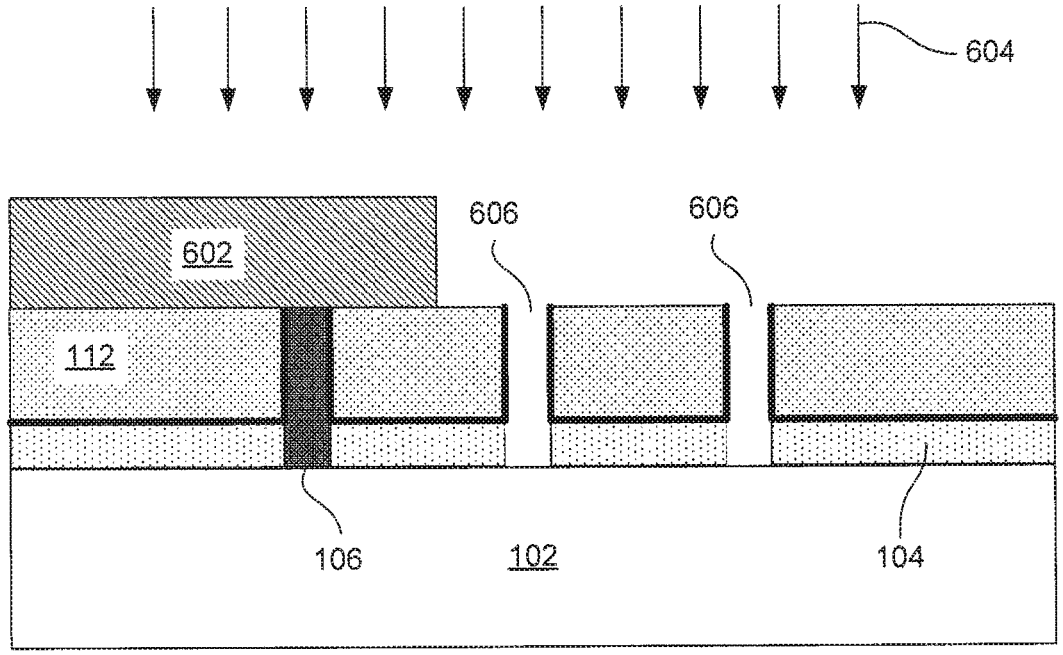

According to the present example, photoresist layer 602 and/or mask layer is used to cover a subset of the elongated semiconductor structures 106 as shown in FIG. 6A. The photoresist layer 602 may be applied after the planarization process 114 described above. The exposed subset of elongated semiconductor structures 106 may then be removed using an etching process 604 as illustrated in FIG. 6B. The etching process 604 may be selective so that it removes the elongated semiconductor structures 106 while leaving other materials, such as the gate layer 112, substantially intact. Removal of the exposed elongated semiconductor structures 106 creates trenches 606 that expose the substrate 102.

Figure 6C:
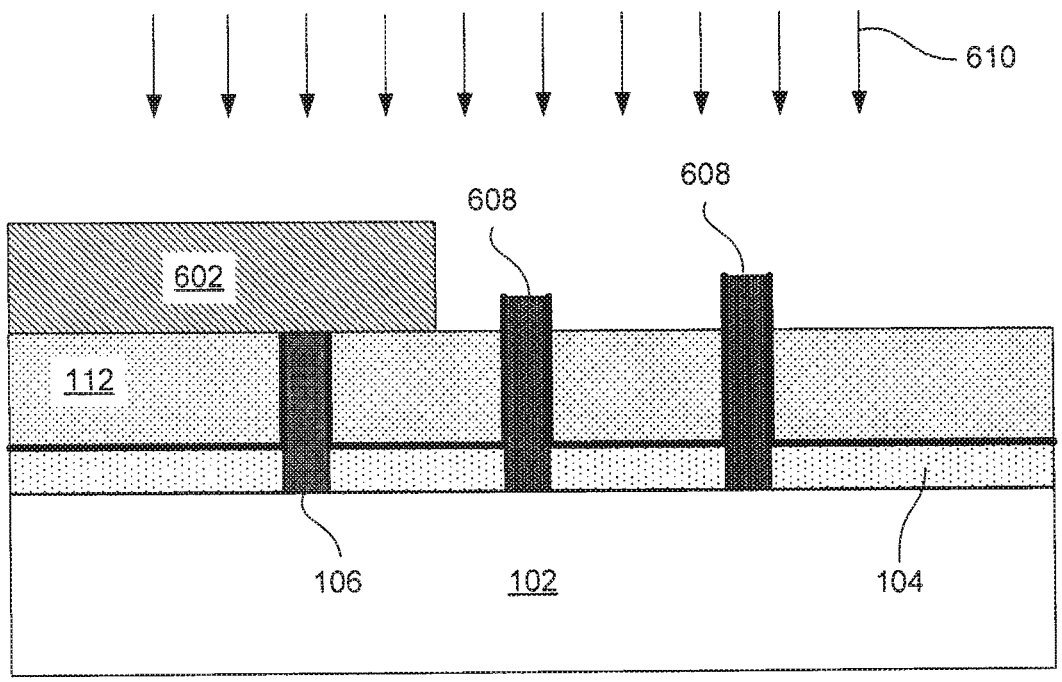

FIG. 6C illustrates an epitaxial growth process 610 to grow elongated semiconductor structures 608. The material used to form elongated semiconductor structures 608 is different than the material used to form the elongated semiconductor structures 106. Specifically, the material used to form the elongated semiconductor structures 608 is designed for a P-type transistor and the material used to form the elongated semiconductor structures 106 is designed for an N-type transistor.

The elongated semiconductor structures 608 may be made of a variety of materials suited for P-type transistors. Additionally, the elongated semiconductor structures 608 may be doped. The doping of the elongated semiconductor structures 608 may occur in-situ. Additionally, the in-situ doping can be changed as the epitaxial growth process 108 proceeds. For example, the in-situ doping can stop and restart as the epitaxial growth process 108 proceeds. In some cases, the doping profile may be graded. In some examples, however, the doping profile may be stepped. The doping concentration of the elongated semiconductor structures 608 may be within a range of about $1\times10^{15}$-$5\times10^{20}$ cm$^3$. In some examples, if the elongated semiconductor structures 608 include two different materials, such as silicon germanium, the ratio of one material to another may change gradually during the process. Thus, the concentration of the second material may have a graded profile. This may be done, for example, by changing flow rates of a precursor during the epitaxial growth process.

Figure 6D:
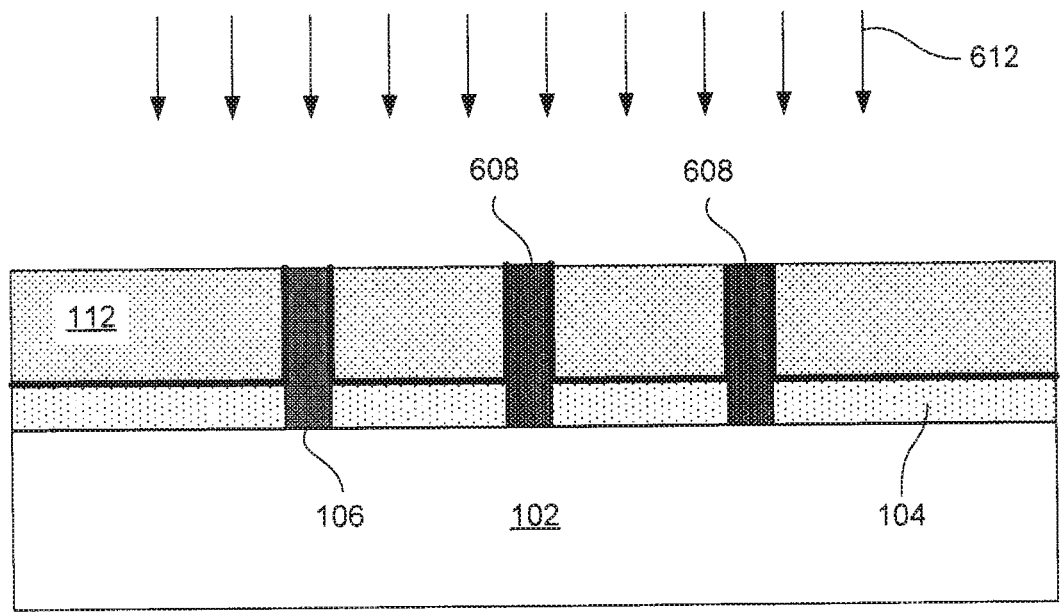

FIG. 6D illustrates a planarization process 612 to remove the photoresist 602 and/or hard mask layer as well as to planarize the elongated semiconductor structures 608. The elongated semiconductor structures 106 and elongated semiconductor structures 608 will have the same height. That height corresponds to the top surface of the gate layer 112.

Figure 7:
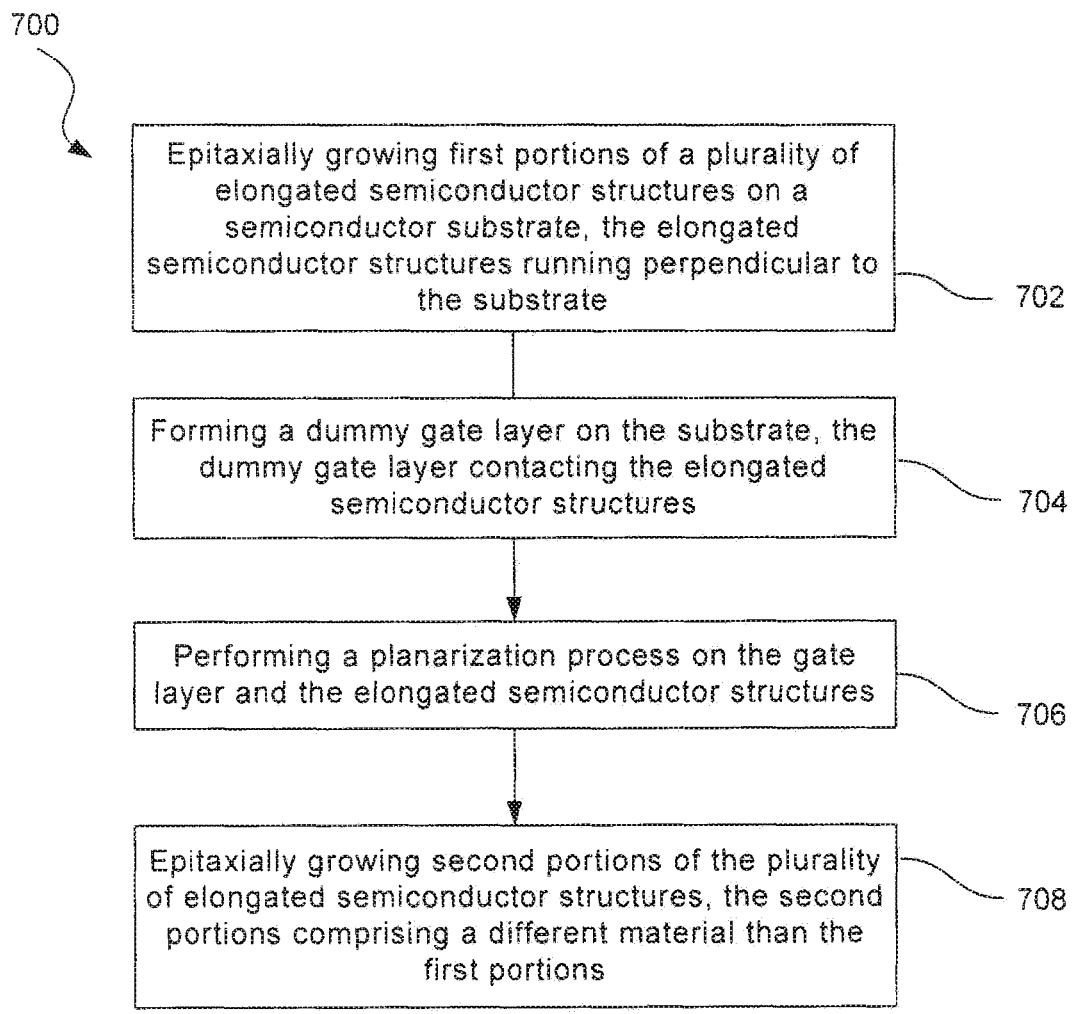
FIG. 7 is a flowchart showing an illustrative method for fabricating dual-material elongated semiconductor structures with substantially coplanar junctions, according to one example of principles described herein.

FIG. 7 is a flowchart showing an illustrative method for fabricating a dual-material elongated semiconductor structure with substantially coplanar junctions. According to the present example, the method 700 includes a step 702 for epitaxially growing first portions of a plurality of elongated semiconductor structures on a semiconductor substrate. The elongated semiconductor structures run perpendicular to the substrate. In other words, the elongated semiconductor structures are formed vertically. As described above, each of the elongated semiconductor structures may have a slightly different height after the epitaxial process is complete. It is desirable, however, that the top surfaces of each of the elongated semiconductor structures are substantially coplanar.

The method 700 further includes a step 704 for forming a gate layer on the substrate. The gate layer contacts the elongated semiconductor structures. Specifically, the gate layer fully covers each of the elongated semiconductor structures. The gate layer may be a dummy gate layer. For example, the gate layer may be made of polysilicon that will eventually be replaced with a metal gate layer. Such a replacement process may occur after other processes that may adversely affect metal gate layer are performed.

The method 700 further includes a step 706 for performing a planarization process on the gate layer and the elongated semiconductor structures. The planarization process may be, for example, a CMP process. The planarization process equalizes the height of each of the elongated semiconductor structures.

The method 700 further includes a step 708 for epitaxially growing second portions of the plurality of elongated semiconductor structures. The second portions are made of a different semiconductor material than the first portions. The epitaxial process will cause the second portions (upper portions) to grow directly onto the exposed upper surfaces of the first portions (lower portions) of the elongated semiconductor structures. The combined lower portions and upper portions may be doped appropriately so they can function as part of a transistor.

According to one example, a method includes epitaxially growing first portions of a plurality of elongated semiconductor structures on a semiconductor substrate, the elongated semiconductor structures running perpendicular to the substrate. The method further includes forming a gate layer on the substrate, the gate layer contacting the elongated semiconductor structures. The method further includes performing a planarization process on the gate layer and the elongated semiconductor structures, and epitaxially growing second portions of the plurality of elongated semiconductor structures, the second portions comprising a different material than the first portions.

According to one example, a method includes forming a first set of elongated semiconductor structures on a semiconductor substrate, the first set of elongated semiconductor structures running perpendicular to the substrate. The method further includes forming a dummy gate layer on the substrate, the dummy gate layer contacting the first set of elongated semiconductor structures, performing a planarization process on the dummy gate layer and the first set of elongated semiconductor structures, and forming, a second set of elongated semiconductor structures on and aligned with the first set of elongated semiconductor structures, the second set of elongated semiconductor structures comprising a different material than the first set of elongated semiconductor structures.

According to one example, a semiconductor device includes a semiconductor substrate, a first set of elongated semiconductor structures extending from the semiconductor substrate in a direction that is perpendicular to the semiconductor substrate, and a second set of elongated semiconductor structures disposed directly on the first set of elongated semiconductor structures, the second set of elongated semiconductor structures comprising a different material than the first set of elongated semiconductor structures. Junctions between the first set of elongated semiconductor structures and the second set of elongated semiconductor structures are substantially coplanar.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor device comprising:
   a semiconductor substrate;
   a first set of elongated semiconductor structures extending from the semiconductor substrate in a direction that is perpendicular to the semiconductor substrate;
   a second set of elongated semiconductor structures disposed directly on the first set of elongated semiconductor structures, the second set of elongated semiconductor structures comprising a different material than the first set of elongated semiconductor structures; and
   polish-stop pillars on the substrate;
   wherein junctions between the first set of elongated semiconductor structures and the second set of elongated semiconductor structures are substantially coplanar.

2. The semiconductor device of claim 1, wherein the first set of elongated semiconductor structures and the second set of elongated semiconductor structures are adapted to function as source, drain, and channel regions.

3. The semiconductor device of claim 1, wherein the first set of elongated semiconductor structures and the second set of elongated semiconductor structures are adapted for both N-type transistors and P-type transistors.

4. The semiconductor device of claim 1, wherein a top surface of the second set of elongated semiconductor structures is at a same level as a junction between a first dielectric layer and a second dielectric layer.

5. A semiconductor device comprising:
   a semiconductor substrate;
   a plurality of elongated semiconductor structures disposed on the semiconductor substrate, the elongated semiconductor structures extending perpendicular to the substrate, the elongated semiconductor structures comprising first portions adjacent the substrate and second portions on the first portions;
   a gate layer disposed on the substrate, the gate layer contacting the elongated semiconductor structures; and
   polish-stop pillars on the substrate;
   wherein the second portions comprise a different material than the first portions.

6. The semiconductor device of claim 5, wherein junctions between the first portions and the second portions are offset from an edge of the gate layer.

7. The semiconductor device of claim 5, wherein a first dielectric layer is disposed around the second portions of the plurality of elongated semiconductor structures.

8. The semiconductor device of claim 7, wherein a second dielectric layer is disposed over the first dielectric layer.

9. The semiconductor device of claim 5, wherein the gate layer comprises a metal gate.

10. The semiconductor device of claim 5, wherein the polish-stop pillars comprise varying heights at different regions of the substrate.

11. The semiconductor device of claim 5, wherein the first portions of the elongated semiconductor structures comprise a first conductivity type, and the second portions of the elongated semiconductor structures comprise a second conductivity type that is different from the first conductivity type.

12. The semiconductor device of claim 5, wherein the first portions and the second portions each have a height within a range of about 4-50 nanometers.

13. The semiconductor device of claim 5, wherein the gate layer has a height within a range of about 5-100 nanometers.

14. The semiconductor device of claim 5, wherein junctions between the first portions and the second portions are offset from an edge of the gate layer within a range of about 0-50 nanometers.

15. The semiconductor device of claim 5, wherein the elongated semiconductor structures comprise nanowires.

16. The semiconductor device of claim 5, wherein the elongated semiconductor structures comprise nanobars.

17. The semiconductor device of claim 5, wherein the first portions and the second portions comprise at least one of: silicon (Si), germanium (Ge), silicon germanium (SiGe), indium arsenide (InAs), indium gallium arsenide (InGaAs), indium antimonide (InSb), or indium gallium antimonide (InGaSb).

18. A semiconductor device comprising:
   a first set of elongated semiconductor structures disposed on a semiconductor substrate, the first set of elongated semiconductor structures running perpendicular to the substrate;
   a gate layer disposed on the substrate, the gate layer contacting the first set of elongated semiconductor structures; and
   a second set of elongated semiconductor structures disposed on and aligned with the first set of elongated semiconductor structures, the second set of elongated semiconductor structures comprising a different material than the first set of elongated semiconductor structures; and
   polish-stop pillars on the substrate.

19. The semiconductor device of claim 18, wherein junctions between the first set of elongated semiconductor structures and the second set of elongated semiconductor structures are offset from an edge of the gate layer within a range of about 0-50 nanometers.

20. The semiconductor device of claim 18, wherein the first set of elongated semiconductor structures and the second set of elongated semiconductor structures comprise one of: nanowires and nanobars.

* * * * *